United States Patent [19]
Doi

[11] Patent Number: 5,632,821
[45] Date of Patent: May 27, 1997

[54] POST TREATMENT METHOD FOR IN-SITU CLEANING

[75] Inventor: Satoshi Doi, Izumi, Japan

[73] Assignee: Anelva Corporation, Japan

[21] Appl. No.: 603,886

[22] Filed: Feb. 22, 1996

[30] Foreign Application Priority Data

Mar. 3, 1995 [JP] Japan ................... 7-070911

[51] Int. Cl.$^6$ .................. B05D 3/00; H01L 21/00
[52] U.S. Cl. ................. 134/1.1; 216/67; 438/905
[58] Field of Search ............. 134/1, 1.1; 156/643.1, 156/646.1; 216/67

[56] References Cited

U.S. PATENT DOCUMENTS

| | | | |
|---|---|---|---|
| 3,892,650 | 7/1975 | Cuomo et al. | 204/192 |
| 5,011,705 | 4/1991 | Tanaka | 427/39 |
| 5,326,723 | 7/1994 | Petro et al. | 437/192 |

FOREIGN PATENT DOCUMENTS

| | | |
|---|---|---|
| 58-092218 | 6/1983 | Japan . |
| 58-092217 | 6/1983 | Japan . |
| 63-011674 | 1/1988 | Japan . |

OTHER PUBLICATIONS

Newboe, Betty, "Cluster Tools: A Process Solution?" *Semiconductor International*, pp. 82–88, Jul., 1990.

Matsuda, A., "Deposition Kinetics of Silicon Films by Plasma CVD," *Researches of the Electrotechnical Laboratory*, No. 864, pp. 1–64, Apr., 1986.

*Primary Examiner*—Nam Nguyen
*Assistant Examiner*—Michael E. Adjodha
*Attorney, Agent, or Firm*—Edward D. Manzo; Mark J. Murphy

[57] ABSTRACT

A method for performing a post treatment effectively in a short period of time after in-situ cleaning for removing residual material remaining in a reaction chamber after a chemical vapor deposition process. The method preferably comprises a post treatment gas containing an element in common with a thin film and reactive with a cleaning gas to form a volatile product being introduced into the reaction chamber by a gas introduction system at such a flow rate that the thin film deposition rate is reaction-limited. The method further comprises plasma forming system forming a plasma by applying electric power to the post treatment gas under the condition that the thin film deposition rate is reaction-limited. The residual cleaning gas reacts with the post treatment gas to form a volatile product which is expelled out by an exhaust system. The cleaning gas is thereby removed without being embedded in the thin film.

14 Claims, 6 Drawing Sheets

POST TREATMENT METHOD FOR IN-SITU CLEANING

BACKGROUND OF THE INVENTION

1. Field of the Invention

The present invention relates to a technique for cleaning a reaction chamber for depositing a thin film.

2. Description of the Related Art

In processes for manufacturing various memories and logic circuits in large scale integrated circuits (131) and thin film transistor (TFT) elements for liquid crystal displays (LCD), a conductive or insulating thin film is formed on a semiconductor wafer or a glass substrate. Such a thin film is formed of a material containing silicon, such as crystalline silicon, polycrystalline silicon, amorphous silicon, silicon nitride, silicon oxide or silicon oxi-nitride. The thin film of such a silicon-containing material, particularly a thin film of amorphous silicon, is conventionally manufactured by a plasma-enhanced chemical vapor deposition (CVD) technique as one of various kinds of thin film forming techniques.

In applying such a plasma-enhanced CVD technique, one important objective is to improve the quality of the thin film deposited. One of the main causes detracting from the quality of the thin film is extraneous materials or impurities contaminating the thin film. An example of how extraneous material interferes with the process is when a chemical species remaining on the surface of plasma CVD hardware, for example the electrodes, the substrate holder and the inner wall of a reaction chamber (hereinafter collectively referred to as "component members"), becomes liberated and contaminates the growing film.

For example, a thin film for a PN junction is deposited on a substrate using a plasma CVD apparatus as described below. First, a mixture gas, prepared by adding a trivalent impurity such as B, Al, Ga or In (for example $B_2H_6$ gas) to silane gas, is used to perform a plasma-enhanced CVD reaction. A P-type semiconductor layer is thereby formed. Then, another mixture gas, prepared by adding a pentavalent impurity such as P or As (for example phosphene ($PH_3$), or arsine ($AsH_3$)), to silane gas, is used to perform a plasma-enhanced CVD reaction on the P-type semiconductor layer. An N-type semiconductor layer is thereby formed. In this process, boron (B) remaining on the component members in the reaction chamber after the first CVD step for forming the P-type semiconductor layer is liberated during the second CVD step for forming the N-type semiconductor layer. If boron is mixed as an extraneous material into the thin film, the desired semiconductor characteristics in the thin film cannot be obtained. In this case, the electrical conductivity of the N-type semiconductor layer is reduced. Conventionally, to prevent such an extraneous material from contaminating the thin film, "in-situ cleaning techniques" are used for cleaning the component members in the reaction chamber after the plasma CVD process. In-situ cleaning techniques refer to a method of cleaning the internal component members of the reaction chamber in a self-cleaning manner by using plasma generated in the reaction chamber without exposing the component members to the atmosphere.

One of the most commonly-used in-situ cleaning techniques is based on a method of supplying, as a cleaning gas, a gas having high reactivity with the thin film material, for example a fluorine containing gas, and generating a plasma in the cleaning gas. The residual material attached to the component members is removed by etching with the cleaning gas plasma. Thus, the component members are cleaned by the cleaning gas plasma.

For example, an amorphous silicon thin film is deposited on a substrate in a plasma-enhanced CVD process. After the formation of the thin film, the substrate is moved out of the reaction chamber. Thereafter, a gas introduction system is operated to introduce a gas containing fluorine, for example carbon tetrafluoride ($CF_4$) or nitrogen trifluoride ($NF_3$). A plasma generator is operated in this fluorine containing gas to generate plasma. The residual material is removed by etching with the fluorine active species produced in the plasma. The removed residual material is expelled out of the reaction chamber through an exhaust system.

However, when such an in-situ cleaning is performed, the cleaning gas residue attaches to the internal component members of the reaction chamber and remains in the reaction chamber. Hence, another problem arises in that, during the next step in the plasma CVD process cleaning, gas residue having high reactivity becomes mixed in the thin film as an extraneous material. Further, the reaction for depositing the thin film is hindered due to the presence in the reaction chamber of the cleaning gas residue having high reactivity, for example a gas containing fluorine which has been liberated from the component members, thereby reducing the thin film deposition rate.

A treatment to be performed after the in-situ cleaning ("post treatment", hereinafter) has been proposed as a technique for solving the problems resulting from the cleaning gas residue. This post treatment is a process of introducing a gas which reacts with the cleaning gas residue to form a product having high volatility. For example, if the above-mentioned fluorine containing gas is used as the cleaning gas, then hydrogen gas is introduced to generate hydrogen gas plasma. Excited hydrogen generated in the hydrogen gas plasma reacts with the residual fluorine chemical species, for example elemental fluorine or a fluorine compound, to produce hydrogen fluoride (HF). Since hydrogen fluoride has a high vapor pressure, it is evacuated out of the reaction chamber through an exhaust system by a vacuum pump.

The above-described conventional post treatment method has a disadvantage in that the period of time required for such post treatment is considerably long.

For example, if fluorine chemical species are removed by excited hydrogen as described above, the distribution density of the plasma in the reaction chamber tends to be the highest in the space in between the electrodes and gradually decreases as the distance away from the electrodes increases. Therefore, if only hydrogen gas plasma is employed, several quarter hours are necessary to supply a sufficiently large amount of excited hydrogen to all component members in the reaction chamber. More particularly, the excited hydrogen cannot easily reach all of the chamber walls. The time period for the hydrogen gas post treatment also depends upon the amount of generation and the life of the excited hydrogen in the hydrogen gas plasma. A post treatment requiring such a long period of time is not suitable for a mass-production plasma CVD process.

SUMMARY OF THE INVENTION

In view of these problems, an object of the present invention is to provide a method of effectively performing post treatment for in-situ cleaning within a short period of time.

To achieve this object, according to the present invention, there is provided a post treatment method for removing the cleaning gas residue remaining in the reaction chamber after in-situ cleaning. In the post treatment method of the present invention, electric power is applied to the post treatment gas to generate a plasma. The post treatment gas reacts with the cleaning gas residue to produce a volatile product. This volatile product is then exhausted from the reaction chamber, thereby removing the cleaning gas residue.

The post treatment gas is preferably a reactive gas, containing an element in common with the thin film to be deposited on a substrate, and is capable of reacting with the cleaning gas to form a volatile product. The post treatment gas is preferably introduced into the reaction chamber at a flow rate such that the deposition rate of a thin film deposited by the post treatment gas is reaction-limited. Further, electric power for generating plasma is preferably applied to the post treatment gas so that the deposition rate of the thin film deposited by the post treatment gas is reaction-limited.

To minimize the amount of extraneous material contaminating the thin film after the post treatment, the same gas as the thin film forming gas is used as the post treatment gas. In order for the deposition of the thin film by the post treatment gas to be at a deposition rate according to a reaction limited condition, the flow rate of post treatment gas per unit of electric power is preferably set higher during post treatment than during the thin film forming process. Preferably, the thin film deposited on the substrate is a silicon thin film, the cleaning gas is a gas containing fluorine, the post treatment gas is silane, and the main element of both the post treatment gas and the thin film is silicon.

Most preferably, the post treatment of the present invention is used during the process of depositing amorphous silicon thin film.

In the above-described method of the present invention for post treatment after in-situ cleaning, a gas containing an element in common with a thin film is introduced into the reaction chamber. This gas reacts with the cleaning gas residue attached to component members in the reaction chamber to form a volatile product. The volatile product is evacuated out of the reaction chamber through an exhaust system.

BRIEF DESCRIPTION OF THE DRAWINGS

In describing the present invention or its preferred embodiment(s), reference is made to accompanying drawings wherein.

DESCRIPTION OF THE PRESENTLY PREFERRED EMBODIMENT

Figure 1:
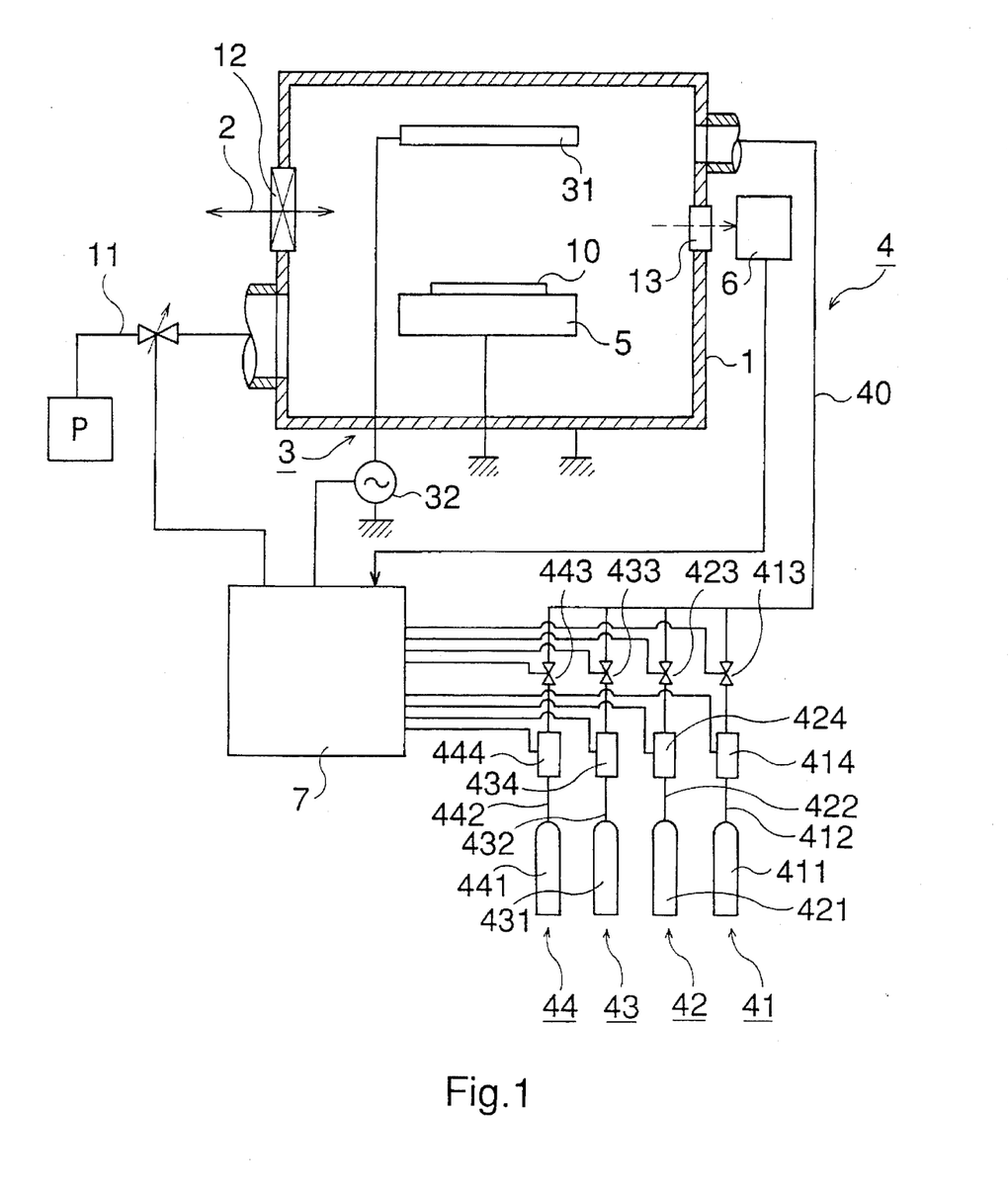
FIG. 1 is a schematic cross-sectional representation of a plasma CVD apparatus used in an embodiment of the method of the present invention.

An embodiment of the present invention will be described below. FIG. 1 is a schematic representation showing a reaction chamber and other apparatus used in an embodiment of the present invention. The reaction chamber is, preferably, a plasma CVD process module in a TFT Manufacturing Cluster Tool "ANELVA C9000 Series" made by ANELVA CORPORATION of Tokyo, Japan.

The module reaction chamber 1 shown in FIG. 1 has an exhaust system 11 for evacuating the reaction chamber to reduce pressure, a gas introduction system 4 for introducing various gases into the reaction chamber 1, and a plasma generator 3 for generating plasma. A substrate holder 5, on which a substrate 10 is placed, is provided in the reaction chamber 1. A monitor means 6 for monitoring the amount of a product formed by the plasma is provided on a side wall of the reaction chamber 1. A gate valve 12 for transporting a substrate in and out is also provided in a side wall of the reaction chamber. A control system 7 for controlling the operation of the plasma CVD hardware thus provided is connected to each hardware component.

The substrate 10 is carried into the reaction chamber 1 through the gate valve 12 by a substrate transport system 2, and is then placed on the substrate holder 5. After a plasma CVD process, the substrate 10 is carried out of the reaction chamber 1 by the substrate transport system 2.

In the exhaust system 11, a turbo molecular pump (designated "P") is provided to reduce the pressure in the reaction chamber 1 to approximately $10^{-3}$ Pa.

The substrate transport system 2 carries a single substrate sheet 10 one by one because the cluster tool is a single-sheet substrate processing system (see B. Newboe "Cluster Tools: A Process Solution"*Semiconductor International* (Jul. 1990)). If a batch system is used, the substrate transport system 2 has a receiver for supporting a plurality of substrate sheets 10.

In this embodiment, substrate 10 is preferably a glass substrate for forming a liquid crystal display.

In the plasma CVD process of this embodiment, an amorphous silicon thin film for electrodes of TFTs is formed.

The plasma generator 3 includes a radio-frequency (RF) plate electrode 31 disposed so as to face the substrate holder 5, a radio-frequency (RF) power source 32 for applying radio-frequency (RF) electric power to the RF electrode 31, and a matching box (not shown) for matching applied RF electric power. The substrate holder 5 and the reaction chamber 1 are grounded and are therefore maintained at a ground potential.

The gas introduction system 4 includes a thin film forming/post treatment gas introduction line 41 for introducing a thin film forming gas and a post treatment gas, a cleaning gas introduction line 42 for introducing a cleaning gas, an auxiliary gas introduction line 43 for introducing an auxiliary gas for forming plasma, and a carrier gas introduction line 44 for introducing a carrier gas. The gas introduction lines 41, 42, 43, and 44 are respectively connected to gas tanks 411, 421, 431, and 441 in which predetermined gases (see infra) are stored. Pipes 412, 422, 432, and 442 are also provided for communication between the gas tanks 411, 421, 431, and 441 and the reaction chamber 1. Conductance valves 413, 423, 433, and 443, mass flow controllers 414, 424, 434, and 444, flowmeters (not shown), and filters (not shown) are provided in the pipes 412, 422, 432 and 442.

Examples of the predetermined gases are described below. Monosilane gas is introduced through the thin film forming gas introduction line 41. Nitrogen trifluoride gas is introduced as a cleaning gas through the cleaning gas introduction line 42. The same type of monosilane gas used as the thin film forming gas is also used as the post treatment gas, as described below. Therefore, one gas introduction line 41 is used both for introducing the thin film forming gas and for introducing the post treatment gas. In this embodiment, through the auxiliary gas introduction line 43, hydrogen gas is preferably introduced as auxiliary gas so as to be mixed with introduced monosilane gas in the thin film forming process.

The pipings 413, 423, 433, and 443 of the gas introduction lines 41, 42, 43, and 44 are connected to a main piping 40 which is connected to the reaction chamber 1.

The monitor means 6 is preferably a spectroscope for detecting the intensity of light emitted from the material excited by the plasma. An observation window 13, formed of a material having a sufficiently high degree of transparency with respect to light having a detection wavelength, is provided in a side wall of the reaction chamber 1. Light caused by the plasma in the reaction chamber 1 passes through the observation window to be received by the spectroscope.

The control system 7 has a memory in which programs for the operation of the plasma CVD) hardware are stored, input/output circuits through which various signals are input and output, and a central processing circuit for making determinations for the operation of the control system 7. Signals from the control system 7 are supplied to the RF power source 32, the exhaust system 11, the conductance valves 413, 423, 433, and 443, and the mass flow controllers 414, 424, 434, and 444 provided in the gas introduction system 4. Conversely, a signal is sent from the monitor means 6 to the control system 7.

An embodiment of the post treatment method of the present invention for in-situ cleaning will now be described.

When the above-described plasma CVD process is completed, the substrate 10 is carried out by the substrate transport system 2 to be moved into a preliminary chamber (not shown) provided adjacent to the reaction chamber 1. Then, the reaction chamber 1 is evacuated by the exhaust system 11 to a pressure of about $10^{-3}$ Pa in order to exhaust residual gases. Thereafter, the cleaning gas introduction line 42 is used to introduce, for example, nitrogen trifluoride gas into the reaction chamber 1 as a cleaning gas. The flow rate of the cleaning gas introduced is approximately 100 seem with respect to a reaction chamber having a capacity of 1000 cm³. The acronym "sccm" is an abbreviation of "standard cubic centimeter per minute" and denotes a flow rate per minute (cm³/min) at 25° C. and 1 atm.

While nitrogen trifluoride gas is being introduced in this manner, the RF power source 32 is used to generate plasma in the nitrogen trifluoride gas. Fluorine reactive species are produced by the nitrogen trifluoride gas. The undesired thin film attached to the component members in the reaction chamber 1 is removed by etching with the fluorine reactive species. This cleaning is performed until an end point is confirmed by a predetermined method, at which point the introduction of the cleaning gas and the operation of the plasma generator 3 are stopped. The method of confirming an end point is, for example, a method of detecting a change in the intensity of light produced by the plasma. The RF electric power applied for generating plasma has a frequency of 13.56 MHz and a power density [the value obtained by dividing the supplied electric power by the area of the discharging surface (the surface of the plasma directly opposite of the RF electrode) of the RF electrode 31] of about 10 W/cm².

Subsequently, the gas in the reaction chamber 1 is again evacuated, and the pressure in the reaction chamber 1 is reduced to about 1 Pa. At this pressure, the post treatment gas introduction line 41 is used to introduce monosilane gas. At this time, the hydrogen gas introduction line 43 is also used to mix hydrogen gas at a predetermined flow rate with monosilane gas. The mixture ratio of hydrogen gas is preferably about 20% of the total gas flow rate. More specifically, for example, the flow rate of monosilane gas is 96 sccm, and the flow rate of hydrogen gas is 24 sccm.

After the introduction of the post treatment gas, the plasma generator 3 is used to generate plasma in the reaction chamber 1. The post treatment gas thereby reacts with the cleaning gas remaining in the reaction chamber 1, so that the remaining cleaning gas residue is removed. RF electric power applied at this time has a frequency of 13.56 MHz and a power density of about 0.1 W/cm².

After the post treatment has been completed, the reaction chamber 1 is evacuated again by the exhaust system 11, the pressure therein is maintained at approximately $10^{-3}$ Pa, and the substrate transport system 2 is used to carry the substrate 10 into the reaction chamber 1 and to place the substrate on the substrate holder 5. Then, the thin film forming gas introduction line 41 and the hydrogen gas introduction line 43 are used to introduce a mixture gas of monosilane and hydrogen, and the plasma generator 3 is again used to generate plasma. A monosilane decomposition reaction thereby results and deposits an amorphous silicon thin film on the substrate 10.

The above-described post treatment method of this embodiment for in-situ cleaning is characterized by using, as the post treatment gas, a reactive gas containing an element in common with the deposited thin film, and capable of reacting with the cleaning gas material to form a volatile product. Such a post treatment gas has been selected on the basis of the results of studies made by the inventor, as described below.

First, to prevent extraneous material from contaminating the thin film in a subsequent thin film forming process, a post treatment gas is used which contains an element in common with the material of the thin film to be deposited. The element common to the post treatment gas and the thin film material forms a matrix of the thin film. For example, amorphous silicon thin film contains a silicon element and a hydrogen element. When forming an amorphous silicon thin film, the silicon element is a common element because the matrix of the amorphous silicon thin film is made of the silicon element. If one were forming a silicon carbide thin film, then either the carbon element or the silicon element could be a common element because the carbon element and the silicon element form the matrix. In the case of forming a silicon carbide film, a gas containing the silicon element, for example a silane gas, or a gas containing silicon carbide, for example methane gas, or a mixture gas containing both of these elements would be used as the post treatment gas. The inventor of the present invention found, in conducting his research, that among such gases there is a reactive gas capable of reacting with a cleaning gas component to form a product having high volatility.

The inventor tried to embed cleaning gas molecules in a silicon-containing thin film deposited on the surface of the component members in the reaction chamber 1. The silicon-containing thin film was deposited by plasma CVD reaction using, as the post treatment gas, the same monosilane-hydrogen mixture gas as the thin film forming gas. However, the phenomenon of the cleaning gas material being embedded in the thin film deposited by the monosilane gas, expected by the inventor, was not observed. Actually, it was found that a volatile product was formed by the reaction of the monosilane gas and the cleaning gas material.

The present invention will be described in more detail with respect to this discovery.

It has been reported that the reactions shown below are mainly caused in a plasma of a mixture gas of monosilane and hydrogen introduced as the post treatment gas, (see for example "DEPOSITION KINETICS OF SILICON THIN FILMS BY PLASMA CVD", Research of the Electrotechnical Laboratory No. 864 (1986)).

$$SiH_4 + e \rightarrow SiH_4^* \qquad (1)$$

$$SiH_4 + e \rightarrow SiH_3 + X' \qquad (2)$$

$$SiH_4 + e \rightarrow SiH^* + X'' \qquad (3)$$

X' and X" in the above reaction formulas have not been determined. The $SiH_3$ produced by reaction (2) is a chemical species which reaches the substrate surface to contribute to the deposition of an amorphous silicon thin film. The $SiH^*$ produced by reaction (3) emits light when an excited electron falls into a grounded state. The emitted light is observed at a wavelength of 414 nm. Both reactions (2) and (3) correspond to a one electron process. That is, the following relationship is established with respect to the electron density (ne) and the film deposition rate (Vdepo):

ne∝[$SiH_3$], ne∝[$SiH^*$], Vdepo∝[$SiH_3$]

Vdepo∝[$SiH^*$]

That is, the process of deposition of an amorphous silicon film can be monitored by observing the emission of light from the SiH molecules.

On the other hand, the fluorine chemical species remaining in the reaction chamber 1 act to quench the light emitted by the SiH molecules. In other words, even if the SiH is excited to become $SiH^*$, such $SiH^*$ reacts immediately with the fluorine chemical species to form a volatile silicon fluoride compound, for example $SiF_4$. Accordingly, it is possible to simultaneously detect a change in the amount of residual fluorine chemical species by monitoring the change in the intensity of light emitted by the SiH.

Based on this reasoning, the inventor of the present invention conducted experiments on the deposition of silicon-containing thin films by monitoring the intensity of light emitted by the SiH to determine whether cleaning gas molecules can be embedded in the thin film.

Figure 2:
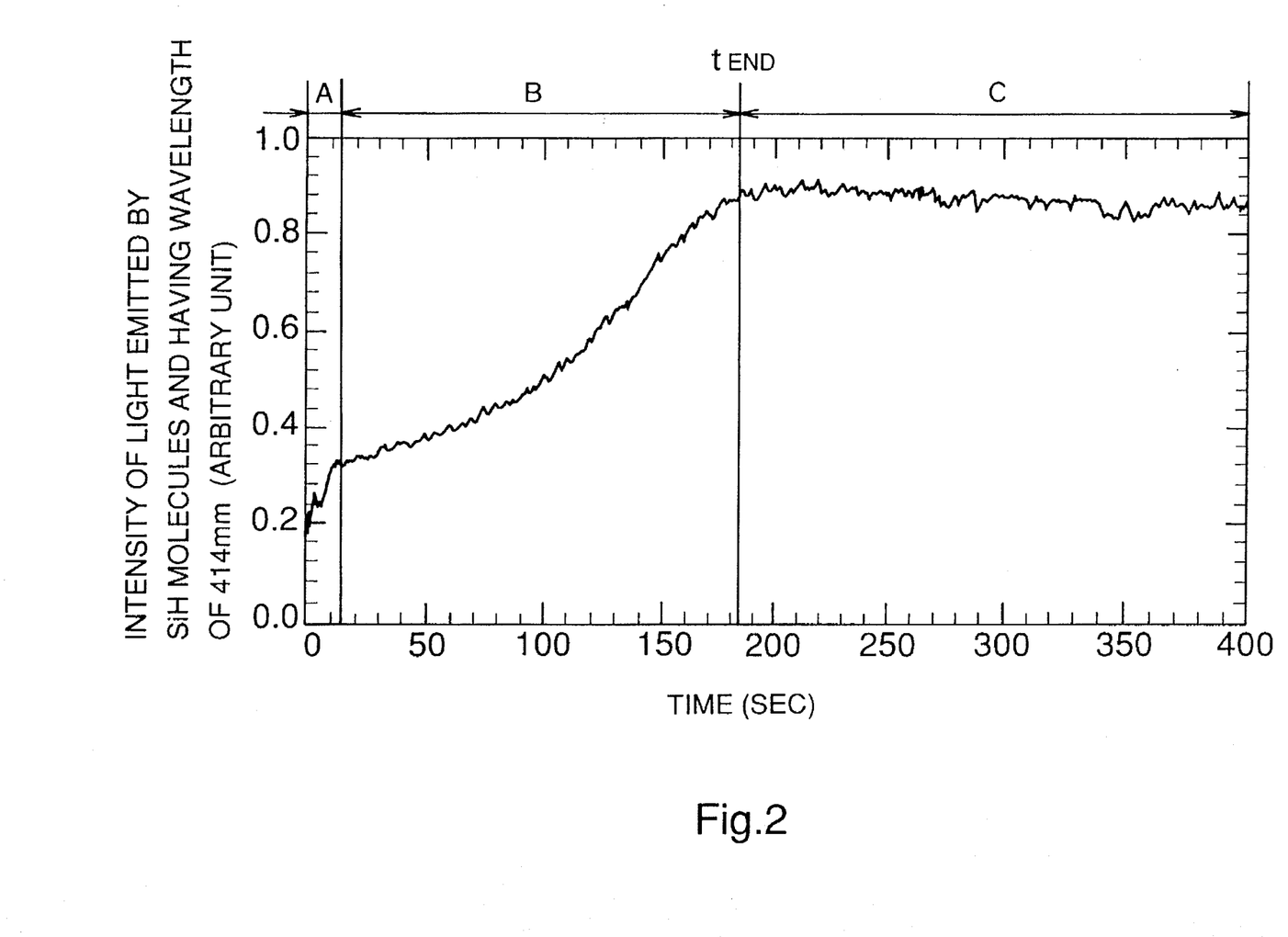
FIG. 2 is a graph showing the result of an experiment made by performing post treatment while monitoring changes in the intensity of light emitted by SiH.

FIG. 2 is a graph that shows changes in the intensity of light emitted by the SiH in the course of the post treatment. In FIG. 2, the ordinate represents the spectroscopic intensity of light (at a wavelength of 414 nm) emitted by the SiH while the abscissa represents time.

Referring to FIG. 2, an increase in the intensity of light emitted by the SiH corresponds to a reduction in the amount of residual fluorine chemical species. For example, when the post treatment is started, the amount of residual fluorine chemical species is large and, accordingly, the amount of $SiH^*$ quenched is large. Hence, even if the SiH is excited to become $SiH^*$, the $SiH^*$ is immediately changed into a compound of $SiF_4$ by the fluorine chemical species. Therefore, the amount of $SiH^*$ existing in the reaction chamber 1 at this stage is small. However, as the post treatment progresses to reduce the amount of fluorine chemical species, the above-mentioned quenching effect is gradually reduced. With this change, the amount of $SiH^*$ in the reaction chamber 1 is increased. When the post treatment further progresses to the point of completely removing the fluorine chemical species, the amount of $SiH^*$ becomes constant. The constant amount of $SiH^*$ at this time indicates that the amount of $SiH^*$ produced becomes saturated due to an equilibrium in the production of $SiH^*$ according to applied RF electric power.

From the above-described study, it is possible to determine completion of the post treatment at the time point $t_{END}$ at which the intensity of light emitted by SiH stops increasing. The time period in FIG. 2 from the start of the treatment to the time $t_{END}$ is about 3 minutes. The result shown in FIG. 2 indicates that the post treatment of this example was completed in a time period of about 3 minutes. Hence, the post treatment of this example could be performed in a time period much shorter than the time of several quarter hours required for the conventional post treatment using hydrogen gas plasma. In the post treatment of this example, the flow rate of monosilane gas was 12 sccm, the flow rate of hydrogen gas was 48 sccm, and RF electric power applied had a power density of about 0.1 W/cm² at a frequency of 13.56 MHz. The pressure of monosilane-hydrogen mixture gas in the reaction chamber 1 was about 100 Pa.

The inventor of the present invention has also examined changes in the intensity of light emitted by the SiH with respect to the gas flow rate, the pressure in the reaction chamber 1, and the RF electric power in the plasma during the post treatment of this embodiment.

Figure 3:
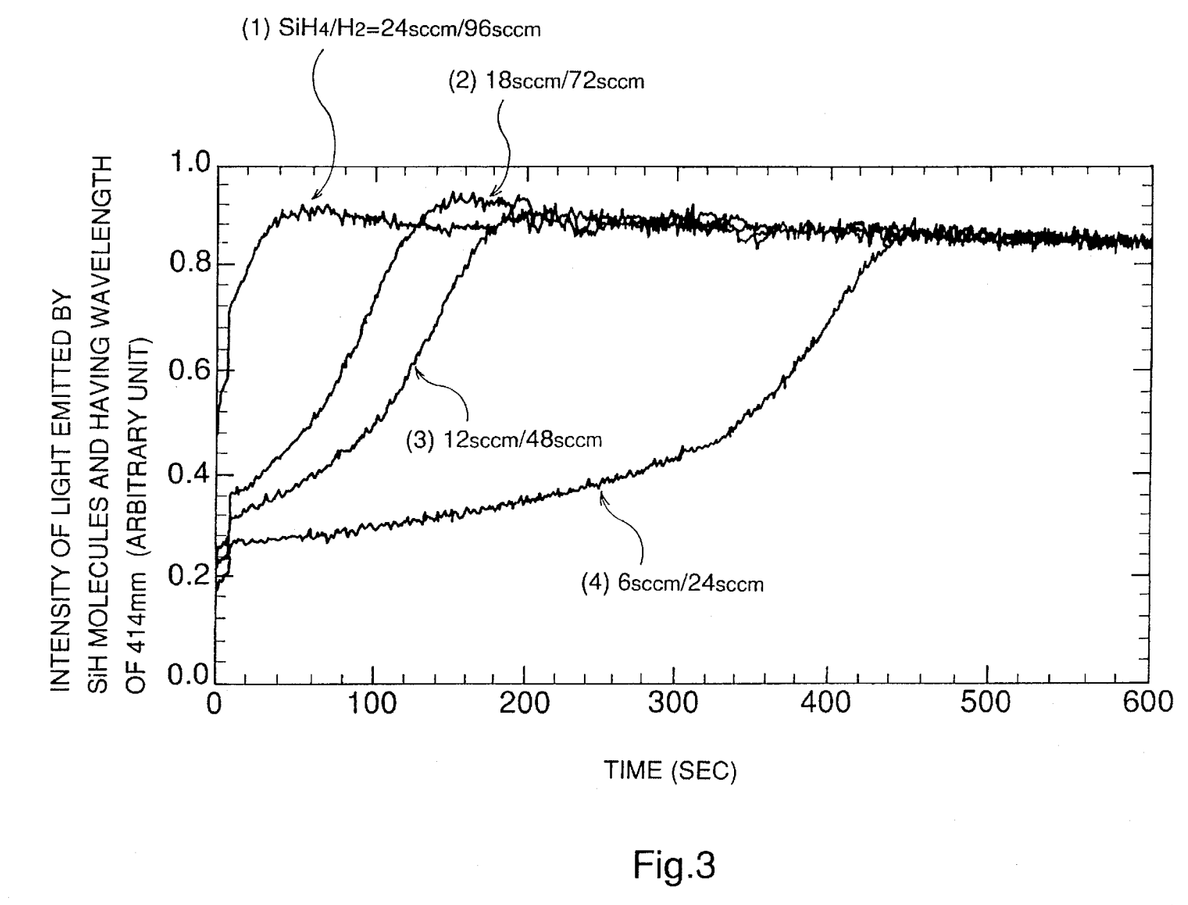
FIG. 3 is a graph showing the result of an experiment made by changing the gas flow rate in the plasma CVD apparatus shown in FIG. 1.
Figure 4:
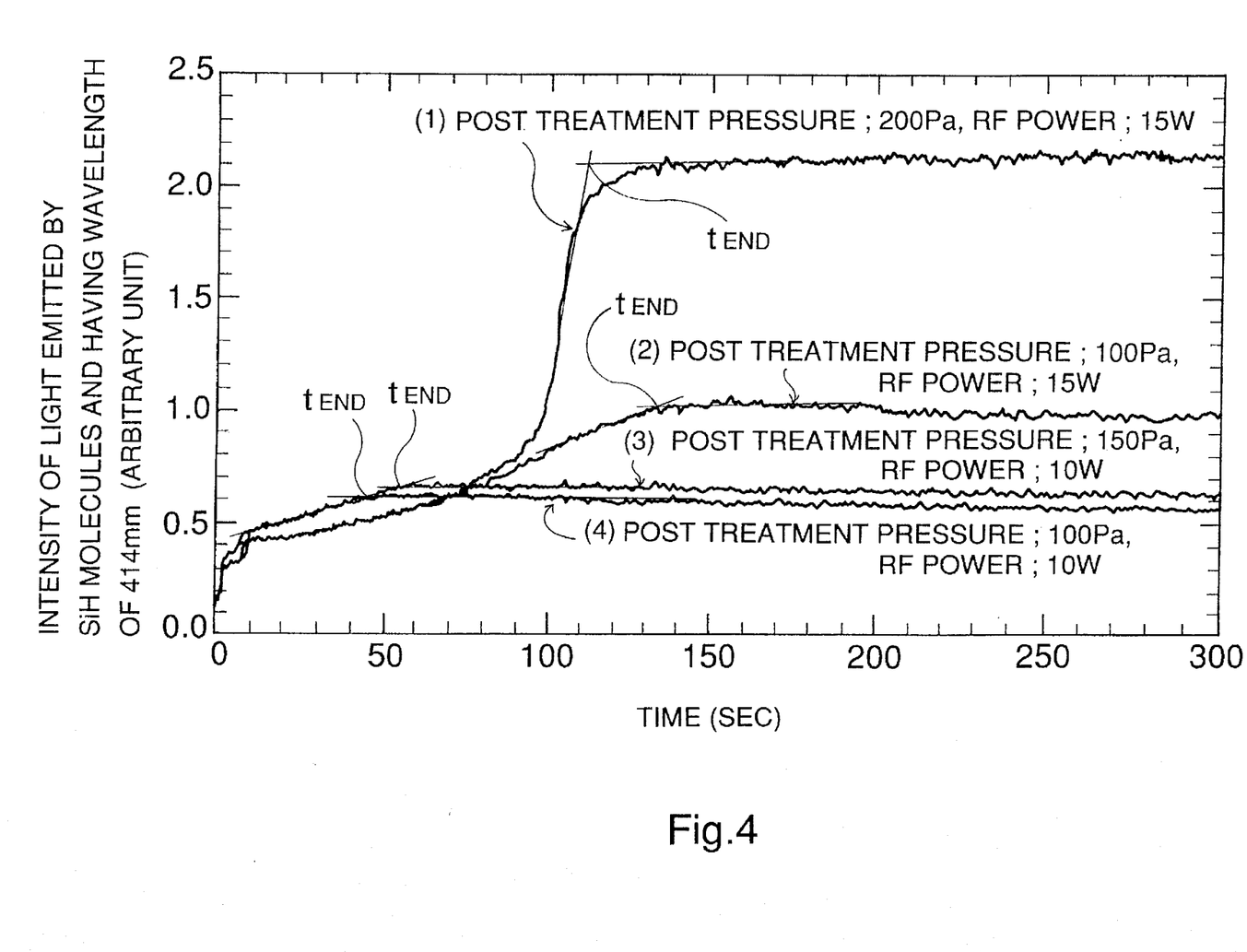
FIG. 4 is a graph showing the result of an experiment made by changing the gas flow rate and the pressure in the plasma CVD apparatus shown in FIG. 1.

FIG. 3 shows changes in the intensity of light emitted by the SiH with respect to the flow rates of monosilane gas and hydrogen gas. FIG. 4 shows changes in the intensity of light emitted by the SiH with respect to pressure in the reaction chamber and RF electric power. The ordinate in both FIGS. 3 and 4 represents the intensity of emitted light at a wavelength of 414 nm while the abscissa represents time, as in FIG. 2.

In FIG. 3, curve (1) represents changes in the intensity of emitted light with respect to treatment time when the flow rates of monosilane and hydrogen gases were 24 sccm and 96 sccm respectively; curve (2) represents intensity changes when the flow rates of monosilane and hydrogen gases were 18 sccm and 72 sccm respectively; curve (3) represents intensity changes when the flow rates of monosilane and hydrogen gases were 12 sccm and 48 sccm (as in FIG. 2) respectively; and curve (4) represents intensity changes when the flow rates of monosilane hydrogen gases were 6 sccm and 24 sccm respectively.

In FIG. 4, curve (5) represents changes in the intensity of emitted light with respect to the treatment time when the pressure was 200 Pa, and the applied RF electde power was 15 W; curve (6) represents intensity changes when the pressure was 100 Pa, and the applied RF electric power was 15 W (as in FIG. 2); curve (7) represents intensity changes when the pressure was 150 Pa, and the applied RF electric power was 10 W; and curve (8) represents intensity changes when the pressure was 100 Pa, and the applied RF electric power was 10 W.

From FIG. 3, it can be understood that the time period to reach the post treatment end time $t_{END}$ was reduced as the monosilane-hydrogen mixture gas flow rate was increased.

However, as shown in FIG. 4, a reduction in the post treatment time, such as that shown in FIG. 3, was not observed even when the pressure in the reaction chamber 1 and the applied RF electric power were changed. As can be understood from the comparison between curves (7) and (8)

of FIG. 4, the time to reach the post treatment end time $t_{END}$ did not substantially change even when the pressure was increased from 100 Pa to 150 Pa. As can be understood from the comparison between curves (8) and (6) of FIG. 4, when the RF electric power was increased, the saturated value of the intensity of emitted light was increased with the increase in plasma density, but the time to reach the post treatment end time $t_{END}$ was also adversely increased.

The experiments shown in FIGS. 3 and 4 were made under conditions in which the thin film deposition rate was reaction-limited, that is, the RF electric power and the thin film deposition rate were in a linear relationship with each other, as described below. In other words, an increase in the RF electric power is accompanied by an increase in the thin film deposition rate. It had been previously thought that if the thin film deposition rate is increased, the above-mentioned time taken to complete the post treatment would be reduced because the embedment of fluorine chemical species by the formation of thin film is promoted. The results shown in FIG. 4, however, are contrary to that anticipated according to the conventional art.

Actually, the time taken to complete post treatment was not reduced even when the RF electric power was increased, as shown in FIG. 4. From this fact, it can be concluded that the formation of silicon thin film is not a major factor in the removal process of fluorine chemical species in the post treatment of this embodiment of the present invention.

Figure 5:
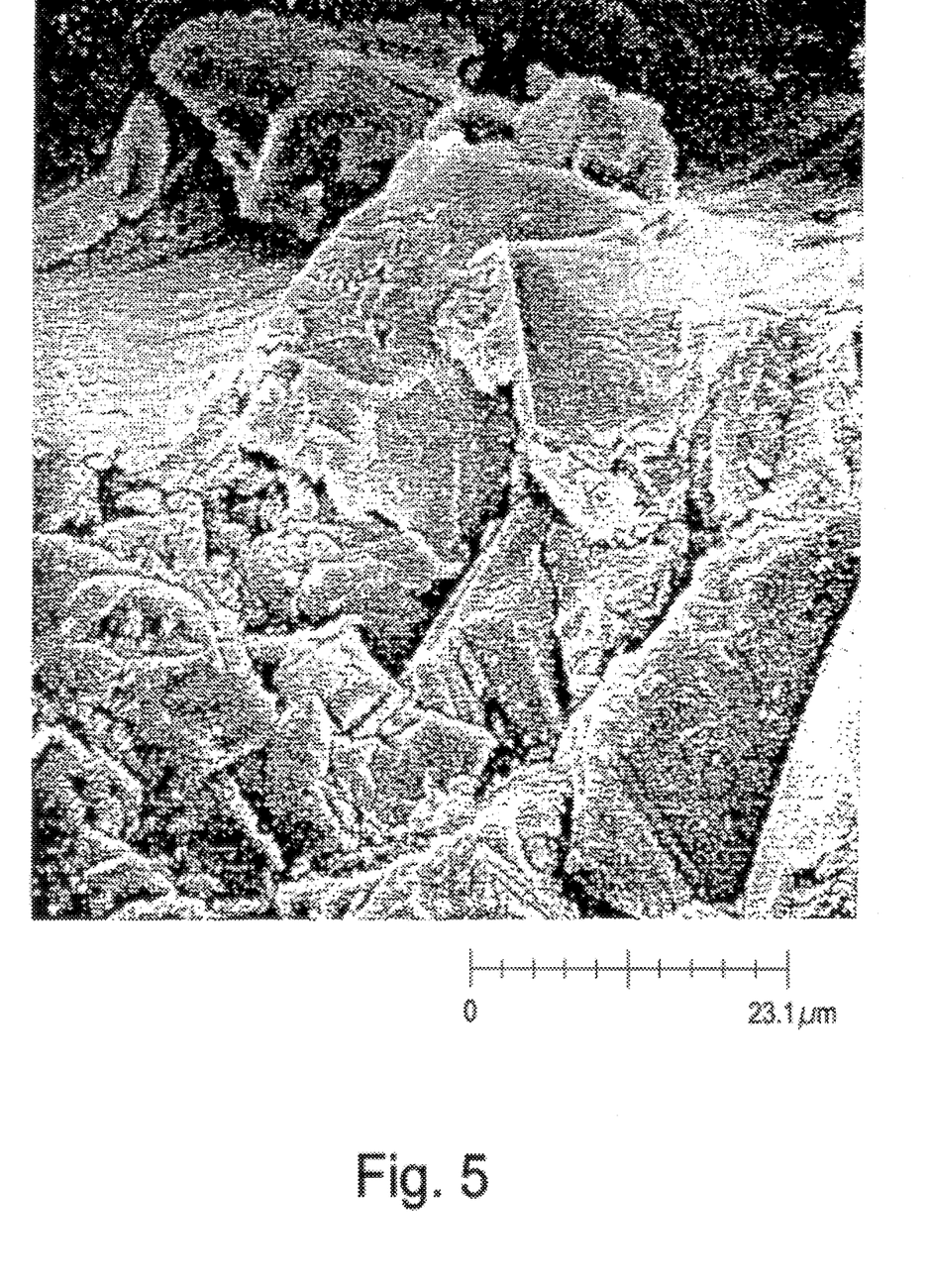
FIG. 5 is a copy of a photograph observed through a scanning electron microscope showing the state of the wall surface of the reaction chamber before the start of post treatment.

FIG. 5 shows a copy of a photograph of a wall surface of the reaction chamber 1 before post treatment. The wall surface was observed with a scanning electron microscope.

As shown in FIG. 5, the morphological surface of the cleaning gas material built up on the wall surface forms complicated irregularities. Therefore, it is possible to completely cover such irregularities in the cleaning gas material, but in order to do so it is necessary to form a substantially thick film.

A considerably long period of time is required to form a thick film on the wall surfaces which are the furthest away from the RF electrode. It is therefore impossible to form a substantially thick film in a post treatment time of about 3 minutes, as in the embodiment shown in FIG. 2.

It is believed that the reaction shown below also takes place between the surface of nitrogen trifluoride residue on the wall surface and the monosilane-hydrogen mixture gas plasma. That is, the plasma decomposes nitrogen trifluoride molecules by the following reaction:

$$NF_3 \rightarrow NF + 2F^*$$

to produce fluorine reactive species. The produced fluorine reactive species attaches to the component members and deactivates to become ordinary fluorine chemical species. Such fluorine chemical species react with a particular chemical species produced from the monosilane in the plasma to produce a silicon fluoride compound, for example $SiF_4$, which is an inactive product having a high vapor pressure and high volatility. (The reaction for producing such a volatile product will be referred to hereinafter as a "post treatment reaction".) The evaporated silicon fluoride compound, for example $SiF_4$, is removed by being expelled out of the reaction chamber 1 by the exhaust system 11.

Fluorine chemical species may remain attached to the wall surface in the form of NF or $NF_2$, as well as nitrogen trifluoride. Fluorine chemical species may also be attached to the wall surface in the form of a compound resulting from a reaction with a material (for example aluminum) of the component members.

As can be understood from the above study, the reaction of a particular chemical species produced from monosilane gas (hereinafter referred to as "chemical species X") and fluorine chemical species is dominant during the post treatment of this example. It may be considered that, essentially, during post treatment, the above-mentioned phenomenon of embedment of fluorine by the deposition of silicon-containing thin film does not occur.

The electric power necessary for producing chemical species X is much smaller than the electric power necessary for forming a thin film containing silicon. Therefore, a sufficient amount of chemical species X can be produced even if the applied RF electric power is small. The chemical species X, which is produced, has a long life and quickly diffuses, even to the chamber walls which plasma cannot easily reach. If the RF electric power is increased, the time period taken to complete the post treatment is lengthened because the decomposition of chemical species X is promoted by the increase in RF electric power to such an extent that the chemical species X is changed into another chemical species Y having a short life. Therefore, it is believed that the increase in the post treatment time is due to a reduction in the absolute amount of chemical species capable of reaching the chamber wall.

These chemical species X and Y cannot presently be determined. However, it is believed that $SiH_4^*$, for example, corresponds to chemical species X while $SiH_3^*$, $SiH^*$ and $H^*$, for example, correspond to chemical species Y.

Taking the above into consideration, the result shown in FIG. 2 will again be discussed. It is believed that in period A when the intensity of emitted light increases abruptly, the post treatment reaction of the fluorine chemical species attached to the structural member at the center of the reaction chamber 1, for example RF electrode 31, by the monosilane/hydrogen mixture gas plasma quickly progresses. As a result, the relative amount of fluorine chemical species abruptly decreases, while that of $SiH^*$ abruptly increases. However, the amount of fluorine chemical species remaining on the wall surface of the reaction chamber 1 is still large while the absolute amount of $SiH^*$ is still small due to quenching by the fluorine chemical species liberated from the wall surface. In period B, the post treatment reaction with the fluorine chemical species attached to the wall surface progresses gradually, so that $SiH^*$ gradually increases. Period B can be said to correspond to a determining step in the post treatment. As the post treatment reaction with the fluorine chemical species attached to the wall surface progresses further, the mount of fluorine chemical species released from the wall surface becomes zero. Thereby the fluorine chemical species has been removed throughout the entire region in the reaction chamber 1, quenching of the $SiH^*$ is completed, and the rate of increase in the amount of $SiH^*$ becomes zero.

Thus, the process of the post treatment of this embodiment is based on the novel finding that the thin film forming gas introduced as a post treatment gas to embed the fluorine chemical species in the thin film actually forms a volatile product by reaction with the fluorine chemical species. The results of the experiments made by the inventor show that, even if thin film is formed, fluorine chemical species is not embedded therein.

Other important conditions for this embodiment are that the post treatment gas is introduced at such a flow rate that the deposition rate of the thin film deposited by the introduced post treatment gas is reaction-limited, and that the plasma generator applies electric power to the post treatment gas such that the deposition rate of the thin film deposited by the post treatment gas is reaction-limited.

Figure 6:
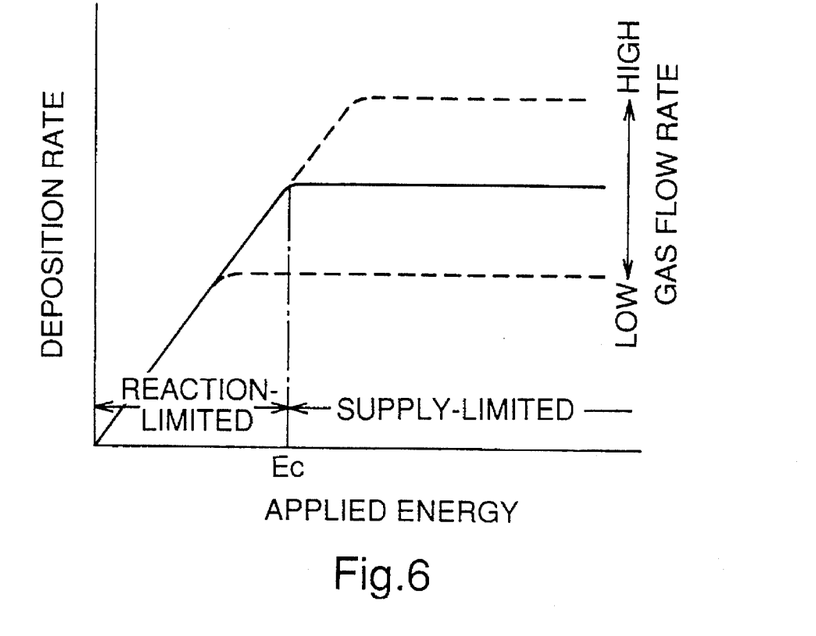
FIG. 6 is a graph showing the relationship between the electric power applied to a gas to form plasma and the thin film deposition rate.
Figure 7:
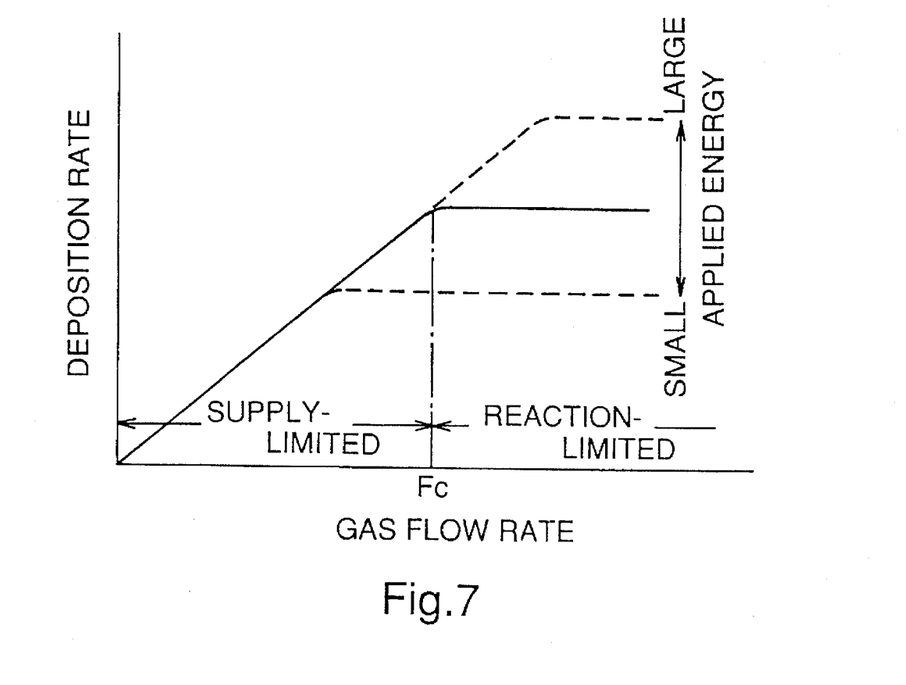
FIG. 7 is a graph showing the relationship between the gas flow rate and the thin film deposition rate.

These conditions will be explained with reference to FIGS. 6 and 7. FIG. 6 is a graph showing the relationship between the electric power applied to the gas to generate plasma and the deposition rate of the thin film. FIG. 7 is a graph showing the relationship between the gas flow rate and the deposition rate of the thin film.

Referring to FIG. 6, as the electric power applied to the raw material gas is increased, the applied power and the deposition rate first have a linear relationship with each other. Hence, the deposition rate increases with an increase in the applied electric power. However, when the applied electric power is equal to or larger than a certain value Ec, the deposition rate becomes constant. This phenomena results because when the applied electric power becomes equal to or larger than Ec, the raw material gas is entirely changed into chemical species. Therefore, to increase the deposition rate when the electric power is equal to or larger than Ec, only the gas flow rate is increased to elevate the constant value of the deposition rate, as shown in FIG. 6.

With respect to the deposition rate, the region in which the applied electric power and the deposition rate are in a linear relationship is called a "reaction-limited" region, while the range in which the deposition rate is constant even if the applied electric power is increased is called a "supply-limited" region. "Reaction-limited" signifies that the maximum level of production of the above-mentioned chemical species has not been reached. Therefore, that "reaction" is a factor in determining the deposition rate because a greater mount of chemical species can be produced by the reaction with an increase in applied electric power. In the supply-limited region, to increase the deposition rate even after the necessary level of production of chemical species has been maximized, it is necessary to increase the rate of supply of the raw material gas. That is, "supply-limited" signifies that the gas supply rate is a factor in determining the deposition rate.

The applied electric power, i.e., RF power, is preferably applied under the condition that the deposition rate is reaction-limited.

This condition has two meanings. First, the deposition rate is reduced by reducing RF electric power. Therefore, if RF electric power is reduced, the deposition rate of the thin film decreases in the reaction-limited state. The fact that the deposition rate decreases means that unnecessary deposition of thin film during post treatment can be limited. Therefore, if this condition is satisfied, the necessary post treatment time can be reduced.

The second meaning, which is not completely understood, is that the reaction during the post treatment of this embodiment is promoted if the applied electric power is so low that the deposition rate is reaction-limited. This is because a sufficiently large mount of chemical X promoting the post treatment reaction can be produced by a comparatively small mount of applied electric power, as discussed supra. It is believed that, if the applied electric power is further increased, chemical species X is dissociated into different chemical species which are difficult to treat by post treatment.

A description will next be given of the gas flow rate with reference to FIG. 7. As shown in FIG. 7, the gas flow rate and the deposition rate first exhibit a linear relationship as the gas flow rate increases. However, when the flow rate is equal to or higher than a certain value Fc, the rate of increase in the deposition rate becomes zero. This is because the maximum mount of chemical species produceable by a certain mount of applied electric power has been reached. Therefore, to increase the deposition rate after this point (Fc), only the applied electric power is increased to elevate the constant value of the deposition rate, as shown in FIG. 7.

In FIG. 7, in contrast to FIG. 6, the region in which the gas flow rate and the deposition rate exhibit a linear relationship is a supply-limited region step, while the region in which the deposition rate is constant even when the gas flow rate is increased is a reaction-limited region step.

As described above, in the post treatment of this embodiment, post treatment gas is introduced at such a flow rate that the deposition rate is reaction-limited. This suggests that, in the reaction-limited state, the deposition rate does not increase even if the gas flow rate increases, as shown in FIG. 7. On the other hand, the time taken to complete post treatment becomes shorter as the gas flow rate increases, as discussed supra. Accordingly, increasing the gas flow rate corresponds to maintaining a reaction-limited condition. Maintaining a reaction-limited condition step promotes only the post treatment reaction without promoting the deposition of the thin film.

If the thin film forming gas is used as the post treatment gas, it is preferable to apply electric power in an mount smaller than that applied during the thin film forming process in order to limit the deposition of unnecessary thin film. Further, to reduce the post treatment time, it is preferable to introduce the post treatment gas at a flow rate higher than the flow rate used during the thin film forming process. In sum, the gas flow rate per unit of applied electric power (for example, in terms of liter/Joule) is controlled so as to be higher during post treatment than during the thin film forming process.

The gas flow rate control is performed through mass flow controllers 414, 424, 434, and 444 provided in the gas introduction system 4. Preferably, high reliable mass flow controllers are used to enable larger amounts of gas to be introduced stably and accurately.

A system for stopping the post treatment of this embodiment will now be described. That is, in this embodiment, the control section 7 functions to stop the post treatment by a signal from the monitor means for monitoring the amount of the product.

As described above, the monitor means 6 preferably comprises a spectroscope which detects the intensity of light emitted by the SiH, i.e., light at a wavelength of 414 nm, and outputs a detection signal. The signal output from the monitor means 6 is sent to the control section 7.

The control section 7 is provided with a memory section (not shown) for storing data from this detection signal. The supplied data is successively stored in the memory section. The control section 7 compares the stored data with the preceding data. When the control section 7 determines that the rate of increase in the intensity of emitted light is zero, it sends a post treatment stop signal to the gas introduction means 4 and the plasma generator 3. More specifically, a program for performing such processing is stored in the memory in the control section 7. The control section 7 thus automatically stops the post treatment when it determines that the rate of increase in the intensity of emitted light is zero.

If such a stop system is not provided, there is a risk that the post treatment gas will be supplied even after the completion of the post treatment. If such an excessive gas supply occurs, the mount of deposition of the silicon-containing thin film by the decomposition of silane gas becomes excessively large. As a result, for example, in such a situation, the period of time of the cleaning step after the next thin film forming process is increased.

In the above-described embodiment, nitrogen trifluoride gas was used as the cleaning gas. Alternatively, gas of other fluorine compounds, such as for example carbon tetrafluoride, sulfur hexafluoride, chlorine trifluoride may be used as the cleaning gas. More specifically, if chlorine trifluoride gas is used, it is possible to remove the residue of a silicon compound without generating plasma. If plasma is generated, about 60 to 80% of an inert gas, such as for example argon gas, is added to the fluorine compound gas. The addition of such an inert gas causes the plasma density to increase so that the cleaning effect is high. "Fluorine-containing gas" referred to in this specification comprises fluorine gas and fluorine compound gases.

In the above-described embodiment, monosilane gas was used as the post treatment gas to deposit the amorphous silicon thin film afterward. Alternatively, other silane gasses such as disilane gas, trisilane gas and tetrasilane gas may be used. Such silane gases can aim be used to form polycrystal silicon thin film or monocrystal silicon thin film.

To deposit silicon oxide thin film afterward, the post treatment gas may be prepared by mixing $N_2O$ gas, i.e., "laughing gas," with the above-mentioned silane gas. If a silicon nitride thin film is deposited, the post treatment gas may be prepared by mixing nitrogen gas with silane gas. Further, if a silicon carbide thin film is deposited afterward, a mixture gas of silane and methane may be used as the post treatment gas. "Silicon-containing thin film" referred to in this specification comprises silicon thin film and thin film of silicon compounds.

If monosilane gas is used as the post treatment gas, it is possible that a silicon-containing thin film is deposited in the reaction chamber by a decomposition reaction of monosilane. However, since the fluorine chemical species are removed by forming a volatile product by the post treatment reaction, there is essentially no possibility of the phenomenon of the fluorine chemical species being embedded in the thin film deposited by the post treatment. This is apparent from the description made supra with reference to FIGS. 4 and 5.

The plasma generator 3 of the above-described embodiment forms capacitive-coupled type RF plasma by coupling an RF circuit with an electrical capacitance of the discharge space. Alternatively, induction-coupled type RF plasma, electron cycrotron resonance plasma, helicon wave plasma, and direct current dipole discharge plasma may be used.

The monitor means 6 of the above-described embodiment detects the intensity of light emitted by SiH. Detection methods other than the method of detecting the intensity of light emitted by SiH may be used. For example, a method of detecting light emitted by Si, and a method of detecting a characteristic value of plasma discharge, as described in Japanese Patent Application No. 4467/1995, may also be adopted. Further, it is possible to adopt a method of monitoring the product in plasma with a mass spectrometer.

According to the post treatment method for in-situ cleaning, as described above, post treatment after cleaning can be performed efficiently in a short period of time. Such short-time post treatment improves the productivity in manufacturing thin film.

Further, according to the post treatment method for in-situ cleaning, no extraneous material is mixed in the thin film after post treatment. Since the same gas as the thin film forming gas is used as the post treatment gas, the quality of the thin film produced can be further improved.

What is claimed is:

1. A method for performing a post treatment comprising the steps of:

introducing a post treatment gas into a reaction chamber after in-situ cleaning;

applying electric power to the post treatment gas to generate a plasma so that a residual cleaning gas and the post treatment gas react with each other to form a volatile product; and removing the residual cleaning gas by expelling the volatile product out of the reaction chamber, wherein the post treatment gas is a reactive gas which contains an element in common with a thin film deposited on a substrate, and which reacts with the cleaning gas to form the volatile product, where the post treatment gas is introduced into the reaction chamber at a flow rate such that the deposition rate of thin film deposited by the post treatment gas is reaction-limited, and wherein the plasma is generated by applying electric power to the post treatment gas so that the deposition rate of the thin film formed by the post treatment gas is reaction-limited.

2. A method according to claim 1, wherein the post treatment gas is the same as a gas used for thin film formation.

3. A method according to claim 2, wherein the flow rate of the post treatment gas per unit of electric power is higher during the post treatment than during the film forming process.

4. A method according to claim 3, wherein the thin film deposited on the substrate comprises a silicon-containing thin film, the cleaning gas comprises a fluorine-containing gas, and the post treatment gas comprises silane.

5. A method according to claim 4, wherein the element that the post treatment gas has in common with the thin film comprises silicon.

6. A method according to claim 1, wherein the post treatment is used when amorphous silicon thin film is deposited by a plasma enhanced chemical vapor deposition reaction.

7. A method for performing a post treatment comprising the steps of:

introducing a post treatment gas into a reaction chamber after in-situ cleaning;

applying electric power to the post treatment gas to generate a plasma so that a residual cleaning gas and the post treatment gas react with each other to form a volatile product; and removing the residual cleaning gas by expelling the volatile product out of the reaction chamber, wherein the post treatment gas is a reactive gas which contains an element in common with a thin film deposited on a substrate, and which reacts with the cleaning gas to form the volatile product.

8. A method according to claim 7 where the post treatment gas is introduced into the reaction chamber at a flow rate such that the deposition rate of thin film deposited by the post treatment gas is reaction-limited.

9. A method according to claim 7 wherein the plasma is generated by applying electric power to the post treatment gas so that the deposition rate of the thin film formed by the post treatment gas is reaction-limited.

10. A method according to claim 9, wherein the flow rate of the post treatment gas per unit of electric power is higher during the post treatment than during the film forming process.

11. A method according to claim 10, wherein the post treatment gas is the same as a gas used for thin film formation.

12. A method according to claim 7, wherein the thin film deposited on the substrate comprises a silicon-containing thin film, the cleaning gas comprises a fluorine-containing gas, and the post treatment gas comprises silane.

13. A method according to claim 12, wherein the element that the post treatment gas has in common with the thin film comprises silicon.

14. A method according to claim 7, wherein the post treatment is used when amorphous silicon thin film is deposited by a plasma enhanced chemical vapor deposition reaction.

* * * * *